United States Patent
Iseda et al.

(10) Patent No.: US 11,242,471 B2
(45) Date of Patent: *Feb. 8, 2022

(54) CONDUCTIVE COMPOSITION AND CONDUCTIVE MOLDED ARTICLE

(71) Applicant: Mitsuboshi Belting Ltd., Kobe (JP)

(72) Inventors: Taisuke Iseda, Hyogo (JP); Masahiro Iwamoto, Hyogo (JP)

(73) Assignee: Mitsuboshi Belting Ltd., Kobe (JP)

( * ) Notice: Subject to any disclaimer, the term of this patent is extended or adjusted under 35 U.S.C. 154(b) by 329 days.

This patent is subject to a terminal disclaimer.

(21) Appl. No.: 15/121,076

(22) PCT Filed: Feb. 12, 2015

(86) PCT No.: PCT/JP2015/053877
§ 371 (c)(1),
(2) Date: Aug. 24, 2016

(87) PCT Pub. No.: WO2015/125692
PCT Pub. Date: Aug. 27, 2015

(65) Prior Publication Data
US 2016/0362585 A1   Dec. 15, 2016

(30) Foreign Application Priority Data

Feb. 24, 2014 (JP) .............................. JP2014-032895
Feb. 5, 2015 (JP) .............................. JP2015-021464

(51) Int. Cl.
| | |
|---|---|
| *C09J 9/02* | (2006.01) |
| *C08L 63/00* | (2006.01) |
| *C08L 101/12* | (2006.01) |
| *C08K 3/08* | (2006.01) |
| *C08G 59/24* | (2006.01) |
| *C08G 59/50* | (2006.01) |
| *C09J 163/00* | (2006.01) |
| *H01B 1/22* | (2006.01) |
| *C09J 9/00* | (2006.01) |
| *C09J 11/04* | (2006.01) |
| *C09K 5/14* | (2006.01) |

(52) U.S. Cl.
CPC .............. *C09J 9/02* (2013.01); *C08G 59/245* (2013.01); *C08G 59/5033* (2013.01); *C08K 3/08* (2013.01); *C08L 63/00* (2013.01); *C08L 101/12* (2013.01); *C09J 9/00* (2013.01); *C09J 11/04* (2013.01); *C09J 163/00* (2013.01); *C09K 5/14* (2013.01); *H01B 1/22* (2013.01); *C08K 2003/0806* (2013.01); *C08K 2201/001* (2013.01); *C08K 2201/003* (2013.01)

(58) Field of Classification Search
CPC ...... C08G 59/5033; C08G 59/245; C09J 9/02; C09J 163/00; C09J 11/04; C09J 9/00; B32B 15/00; B32B 7/12; C08K 2003/0806; C08K 2201/001; C08K 2201/003; C08K 3/08; C08K 3/10; C08K 3/22; C08K 7/00; C08L 101/12; C08L 63/00; C09K 5/14; H01B 1/22

See application file for complete search history.

(56) References Cited

U.S. PATENT DOCUMENTS

| | | | |
|---|---|---|---|
| 4,912,179 A * | 3/1990 | Murakami | ........... C08G 59/245 525/504 |
| 5,891,367 A | 4/1999 | Basheer et al. | |
| 8,419,981 B2 | 4/2013 | Choi | |
| 2012/0119153 A1 | 5/2012 | Choi | |
| 2013/0041088 A1* | 2/2013 | Park | ........................ H01L 24/29 524/502 |
| 2014/0099537 A1 | 4/2014 | Kato et al. | |
| 2015/0247067 A1 | 9/2015 | Iseda et al. | |
| 2015/0252224 A1 | 9/2015 | Iseda et al. | |
| 2015/0344749 A1* | 12/2015 | Ochi | .......................... C09J 9/02 252/75 |

FOREIGN PATENT DOCUMENTS

| | | |
|---|---|---|
| CN | 101935438 A | 1/2011 |
| CN | 102467989 A | 5/2012 |
| CN | 104685002 A | 6/2015 |
| EP | 2902427 A1 | 8/2015 |
| EP | 2902449 A1 | 8/2015 |
| JP | S62-145601 A | 6/1987 |
| JP | S6431874 A | 2/1989 |
| JP | H11-343397 A | 12/1999 |
| JP | 2002-050227 A | 2/2002 |
| JP | 3429985 B2 | 7/2003 |
| JP | 2004183010 A | 7/2004 |
| JP | 2006111903 A | 4/2006 |
| JP | 2008-171828 A | 7/2008 |
| JP | 4144856 B2 | 9/2008 |
| JP | 2009-144188 A | 7/2009 |

(Continued)

OTHER PUBLICATIONS

Machine translation of JP 2011-187194, Sep. 22, 2011.*

(Continued)

*Primary Examiner* — John D Freeman

(74) *Attorney, Agent, or Firm* — Banner & Witcoff, Ltd.

(57) ABSTRACT

The present invention relates to a conductive composition containing a conductive metal powder and a resin component, in which the conductive metal powder contains at least a metal flake having a crystalline structure in which a metal crystal grows in a flake shape, and the resin component contains an aromatic amine skeleton.

5 Claims, No Drawings

(56) References Cited

FOREIGN PATENT DOCUMENTS

| JP | 4399799 B2 | 1/2010 |
|---|---|---|
| JP | 2011-187194 A | 9/2011 |
| JP | 2012-092442 A | 5/2012 |
| JP | 5827203 B2 | 10/2015 |
| JP | 5859949 B2 | 12/2015 |
| TW | 201308716 A1 | 2/2013 |
| WO | 2014-050155 A1 | 4/2014 |
| WO | 2014-050156 A1 | 4/2014 |

OTHER PUBLICATIONS

Fukuda Metal Foil and Powder AgC—A product literature, 2016, downloaded on Nov. 20, 2017 from https://www.fukuda-kyoto.co.jp/03product-e/data1-04.html.*
Machine translation of JP 2004-183010, Jul. 2, 2004.*
Mar. 16, 2017—(TW) Office Action—App—104105899—Eng Tran.
Jul. 4, 2017—(TW) Office Action—App 104105899—Eng Tran.
Aug. 2, 2017—(CN) Office Action—App 201580010255.9—Eng Tran.
Sep. 20, 2017—(EP) Extended European Search Report—15751914.
May 19, 2015—International Search Report—Intl App PCT/JP2015/053877.
Jul. 26, 2016—(JP) Notification of Reasons for Refusal—App 2015-021464—Eng Tran.
Oct. 24, 2017—(KR) Office Action—App 10-2016-7022931 and Eng. Tran.
Apr. 18, 2018—(CN) Office Action—App 201580010255.9—Eng Tran.
Feb. 20, 2019—(ID) Office Action—App P00201605528—Eng Tran.
Mar. 13, 2019—(EP) Office Action—App 15751914.1.

* cited by examiner

CONDUCTIVE COMPOSITION AND CONDUCTIVE MOLDED ARTICLE

CROSS REFERENCE TO RELATED APPLICATIONS:

This is a U.S. National Phase Application under 35 U.S.C. § 371 of International Application No. PCT/JP2015/053877, filed Feb. 12, 2015, which claims priority to Japanese Application Nos. 2014-032895 filed Feb. 24, 2014 and 2015-021464 filed Feb. 05, 2015, respectively, and which was published Under PCT Article 21(2), the entire contents of each of which are incorporated herein by reference.

TECHNICAL FIELD

The present invention relates to a conductive composition useful for forming conductive adhesives, electrodes or the like and a molded body (conductive molded body) containing a conductive portion (conductive adhesive layer, electrode, wiring, etc.) formed of the conductive composition.

BACKGROUND ART

Conductive compositions (conductive pastes) containing a conductive metal powder (conductive filler) such as a silver paste have been used for forming electrodes or circuits of electronic components. Of these, in the conductive paste containing a thermoplastic or thermosetting resin, usually, conductivity is realized by the contact of conductive fillers one another resulting from the shrinkage of the used resin, and also close contact or adhesiveness to a base material is secured by the presence of a resin (binder). Therefore, in the conductive paste containing such a binder, in order to obtain sufficient conductivity, it is important to increase the contact area among the conductive metal powders. From this point of view, as the conductive metal powder, an attempt of using a metal flake (a flaky metal powder) has been made.

For example, JP-A-2008-171828 (Patent Document 1) discloses a conductive paste containing a flaky silver powder and an organic resin. The document exemplifies, as the organic resin, a wide range of organic resins such as polyester resins, modified polyester resins (urethane-modified polyester resins, etc.), polyether-urethane resins, polycarbonate-urethane resins, vinyl chloride-vinyl acetate copolymers, epoxy resins, phenolic resins, acrylic resins, polyamideimides, nitrocellulose, cellulose acetate butyrate, and cellulose acetate propionate. In particular, polyester resins and urethane-modified polyester resins are used in Examples from the viewpoints of bending resistance and the like.

Moreover, JP-A-2012-92442 (Patent Document 2) discloses a flaky silver powder of which average particle diameter and BET specific surface area have a specific relationship. In this document, as a resin used in a conductive paste, there are exemplified epoxy resins, acrylic resins, polyester resins, polyimide resins, polyurethane resins, phenoxy resins, silicone resins, and the like and polyester resins are used in Examples.

These conductive pastes exhibit a certain level of conductivity, but a further improvement in conductivity and adhesiveness has been desired.

BACKGROUND ART DOCUMENTS

Patent Documents

Patent Document 1: JP-A-2008-171828 (Claims, paragraphs [0014] to [0022], Examples)
Patent Document 2: JP-A-2012-92442 (Claims, paragraph [0026], Examples)

SUMMARY OF THE INVENTION

Problems that the Invention is to Solve

Accordingly, an object of the present invention is to provide a conductive composition which can realize excellent conductivity even in the case where an organic resin is contained, and a molded body having a conductive portion formed of the conductive composition.

Another object of the present invention is to provide a conductive composition which can improve or enhance conductivity without impairing close contact or adhesiveness to a base material, and a molded body having a conductive portion formed of the conductive composition.

Yet another object of the present invention is to provide a conductive adhesive having excellent conductivity and heat radiation property and a molded body having a conjugated base material directly bonded by the conductive adhesive.

Means for Solving the Problems

As a result of intensive studies for solving the above problems, the present inventors have found that by combining a metal flake (flaky metal powder) with a specific resin component in a conductive composition, high conductivity can be achieved, also high conductivity and excellent close contact or adhesiveness to a base material can be both achieved, and further, sufficient conductivity and heat radiation property (and furthermore, close contact) can be secured even in the conductive adhesive application or the like where a high heat radiation property is required. Thus, they have accomplished the present invention.

That is, the conductive composition of the present invention is a composition containing a conductive metal powder and a resin component, in which the conductive metal powder contains a metal flake and the resin component contains an aromatic amine skeleton (or an aromatic amine or skeleton derived from an aromatic amine). Incidentally, the "resin component having an aromatic amine skeleton" means a resin component having an aromatic amine skeleton or residue (particularly, an aromatic polyamine skeleton or residue) in a cured or solidified state and includes not only a resin in which an aromatic amine (particularly, an aromatic polyamine) is used as a reaction component but also a resin composition containing a rein and an aromatic amine (particularly, an aromatic polyamine).

In such a composition, the metal flake contains at least a metal flake having a crystalline structure in which a metal (or a metal crystal) grows (or crystal-grows) in a flake shape (or two-dimensionally). For example, the metal flake may be a metal flake in which a value X represented by the following equation is 30% or less (e.g., 20% or less) when diffraction integrated intensity values of a (111) plane and a (200) plane in X-ray diffraction are taken as $I_{111}$ and $I_{200}$, respectively.

$$X=[I_{200}/(I_{111}+I_{200})]\times 100(\%)$$

The resin component may be a thermosetting resin component. In a typical embodiment, the resin component is a thermosetting resin composition containing a thermosetting resin (or a thermosetting resin precursor) and a curing agent (or a crosslinking agent), and the thermosetting resin and/or the curing agent may contain an aromatic amine skeleton. In such a thermosetting resin composition, the curing agent may include an aromatic amine-based curing agent. More specifically, the resin component may be an epoxy resin composition containing an epoxy resin (e.g., an epoxy resin having an epoxy equivalent of 600 g/eq or less) as a thermosetting resin and a curing agent (including an aromatic amine-based curing agent). The aromatic amine-based curing agent may be, for example, an aromatic amine-based curing agent having a structure in which an amino group is directly substituted on an aromatic ring.

The curing agent may contain an aromatic polyamine represented by the following formula (1):

[Chem. 1]

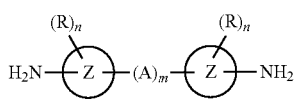

(1)

(in the formula, rings Z each independently represents an arene ring, A represents an alkylene group or alkylidene group, a cycloalkylene group or cycloalkylidene group, an arylene group, an oxygen atom, a sulfur atom, a sulfinyl group, or a sulfonyl group, R represents an alkyl group, a cycloalkyl group, an aryl group, an aralkyl group, an alkoxy group, or a halogen atom, m represents 0 or 1, and n's each independently represents an integer of from 0 to 4.)

The ratio of the resin component may be, for example, approximately from 1 to 50 parts by weight, relative to 100 parts by weight of the metal flake.

The conductive composition of the present invention may be a conductive adhesive (e.g., a die bond paste), for example, a conductive adhesive for bonding a metal base material to a semiconductor base material.

The present invention further also contains a molded body (conductive molded body, conductive member) having at least a conductive portion (or a conductive film) formed of the conductive composition described above. Such a molded body (electric/electronic parts etc.) may be a molded body (or a conjugated member) containing a conjugated base material composed of two base materials and a conductive adhesive that intervenes between the base materials and bonds the two base materials each other, in which the conductive adhesive is a conductive portion formed of the conductive composition described above. Such a molded body may be formed of, for example, a metal base material (a lead frame, etc.), a semiconductor base material (base material on which an electronic part such as a semiconductor chip is mounted), and the conductive composition (or an adhesive layer) described above that intervenes between these base materials and bonds them together.

The present invention further contains a conductive molded body, in which the above-described value X of the conductive portion by the X-ray diffraction described above is 30% or less (e.g., 20% or less).

Advantage of the Invention

The conductive composition of the present invention can realize excellent conductivity although it contains a resin component as a binder. Moreover, the high conductivity can be realized without impairing close contact or adhesiveness to a base material. Furthermore, since the conductive composition of the present invention is also excellent in the conductivity and heat radiation property (thermal conductivity), it is useful as a conductive adhesive.

MODE FOR CARRYING OUT THE INVENTION (Conductive Composition)

The conductive composition of the present invention is composed of a specific conductive metal powder and a specific resin component.

(Conductive Metal Powder)

The conductive metal powder contains at least a metal flake (a flaky metal powder, a plate-shaped metal powder, a scale-shaped metal powder).

(Metal Flake)

Examples of the metal (metal atom) constituting the metal flake include transition metals (e.g., Group 4 metals of the periodic table such as titanium and zirconium; Group 5 metals of the periodic table such as vanadium and niobium; Group 6 metals of the periodic table such as molybdenum and tungsten; Group 7 metals of the periodic table such as manganese and rhenium; Groups 8 to 10 metals of the periodic table such as iron, nickel, cobalt, ruthenium, rhodium, palladium, iridium, and platinum; Group 11 metals of the periodic table such as copper, silver, and gold; etc.), Group 12 metals of the periodic table (e.g., zinc, cadmium, etc.), Group 13 metals of the periodic table (e.g., aluminum, gallium, indium, etc.), Group 14 metals of the periodic table (e.g., germanium, tin, lead, etc.), Group 15 metals of the periodic table (e.g., antimony, bismuth, etc.), and the like. The metals may be used singly or in combination of two or more thereof.

The metals may be metal simple substances and also in the form of metal alloys or compounds of metals and non-metals (e.g., metal oxides, metal hydroxides, metal sulfides, metal carbides, metal nitrides, metal borides, etc.). Usually, the metal is a metal simple substance or a metal alloy in many cases. Typical metals include Groups 8 to 10 metals of the periodic table (iron, nickel, rhodium, palladium, platinum, etc.), Group 11 metals of the periodic table (copper, silver, gold, etc.), Group 13 metals of the periodic table (aluminum, indium, etc.), Group 14 metals of the periodic table (tin, etc.), alloys thereof, and the like. In particular, the metal is preferably a metal (e.g., a metal simple substance or a metal alloy) containing at least a noble metal (particularly, Group 11 metal of the periodic table) such as silver, and particularly a noble metal simple substance (e.g., silver simple substance, etc.). The flakes formed of these metals can be used singly or in combination of two or more thereof.

The metal flake may be any of (i) a metal flake having a crystalline structure (crystalline structure 1) in which a metal (or a metal crystal) grows (or crystal-grows) in a flake shape (or two-dimensionally), (ii) a flaked (or flattened) product of a metal fine particle (or a spherical fine particle) having a crystalline structure (crystalline structure 2) in which a large number of crystallites are assembled, and the like. The metal flake contains at least the metal flake (i).

Incidentally, the metal flake (i) mainly has the crystalline structure in which a crystal single substance is grown into a flaky metal; whereas in the metal flake (ii), usually, a metal fine particle (or an aggregate thereof) having the crystalline structure in which a large number of crystallites are assembled is flaked (or flattened), so that the flaked product also mainly has a crystalline structure in which a large number of crystallites are assembled. Moreover, in the metal flake (ii), since flaking is performed physically, fine irregularities are liable to form on the metal surface.

Although the metal flake (i) mainly having the crystalline structure 1 is suitable because the resistance in crystal boundaries is small as compared with the crystalline structure 2, the plate plane occupying most of the area of the flake among the crystal planes (e.g., mainly a (111) plane in the case of a face-centered cubic lattice, such as the case of a silver flake) has low surface energy and a metal bond at the interface is also hard to form, so that sufficient conductivity cannot be secured in some cases. On the other hand, in the metal flake (ii), resulting from the crystalline structure 2, the resistance at the grain boundaries increases as compared with the crystalline structure 1. However, sintering ability at the metal flake interface increases as compared with the case of the crystalline structure 1 probably resulting from the fine irregularities on the surface, and thus a decrease in resistance owing to the metal bond can be also expected.

From such a point of view, the metal flake may be appropriately selected depending on the desired application, conductivity and the like, but in the present invention, in particular, the metal flake (i) may be preferably used. Even in the case of the metal flake (i), high conductivity can be secured probably because sufficient contact between metal flakes can be secured by combining with the resin component. Furthermore, these components act synergistically and finally, it is possible to realize higher conductivity as compared with the case of using the metal flake (ii).

Incidentally, the degree of crystallinity in the metal flake can be estimated by using the diffraction intensity in X-ray diffraction as an index. In the powder X-ray diffraction method, in the metal flake having the crystalline structure 1 in which anisotropy (orientation) is imparted by crystal growth, diffraction for a flat plane or plate plane mainly appears at large intensity corresponding to the (111) plane but, diffraction for a plane forming a thickness mainly corresponds to the (200) plane and its intensity appears extremely small. On the other hand, in the metal flake (ii) in which a large number of crystallites are assembled, anisotropy (orientation) is small and thus the difference in the diffraction intensity between the (111) plane and the (200) plane decreases. Therefore, the larger the intensity for the (111) plane is and the smaller the intensity for the (200) plane is, the larger the ratio of the crystalline structure 1 is. Specifically, when diffraction integrated intensity values of the (111) plane and the (200) plane in X-ray diffraction (2θ/θ scan method) are taken as $I_{111}$ and $I_{200}$, respectively, a metal flake having a value X represented by the following equation being 30% or less (e.g., 0 to 25%), preferably 20% or less (e.g., 0 to 18%), more preferably 15% or less (e.g., 0 to 12%), and particularly 10% or less (e.g., 0 to 9%) may be taken as the metal flake mainly having the crystalline structure 1 (i.e., the metal flake (i)). The value X may be, for example, approximately 1 to 10%, and preferably 2 to 7.5%. Incidentally, the value X by the X-ray diffraction described above is simply referred to as "value X" in some cases.

$$X=[I_{200}/(I_{111}+I_{200})]\times 100 \ (\%)$$

In the case where such a metal flake is used, even after molding (e.g., after curing treatment of the conductive composition), the conductive portion or the conductive adhesive maintaining the above value of X (or maintaining the crystalline state of the metal flake) can be formed and a conductive molded body having high conductivity can be formed.

In the metal flake (ii), the value X may be usually more than 25% (e.g., 27 to 40%), preferably approximately 30% or more (e.g., 32 to 40%), and usually approximately 27 to 35%.

As the metal flakes, commercially available products may be used or the metal flakes may be synthesized by conventional methods. For example, the metal flake (i) can be synthesized by adapting the production methods described in Japanese Patent No. 3,429,985, Japanese Patent No. 4,144,856, Japanese Patent No. 4,399,799, JP-A-2009-144188, and the like, and the metal flakes described in these documents can be used. The metal flake (ii) may be synthesized by adapting the methods described in Patent Documents 1 and 2 described above.

The average particle diameter of the metal flake may be, for example, approximately 0.1 to 20 μm, preferably 0.3 to 15 μm (e.g., 0.5 to 12 μm) and more preferably 0.7 to 10 μm (e.g., 0.8 to 7 μm), and may be usually approximately 1 to 10 μm. Incidentally, the average particle diameter of the metal flake can be measured, for example, by utilizing a laser diffraction scattering particle size distribution measuring method or the like. In such a measuring method, the average particle diameter (median particle diameter) is measured as a value based on volume.

The average thickness of the metal flake may be, for example, 5 to 1,000 nm, preferably 20 to 500 nm, and more preferably 50 to 300 nm, and may be usually approximately 10 to 300 nm.

The aspect ratio of the metal flake (average particle diameter/average thickness) may be, for example, approximately 5 to 100, preferably 7 to 50, and more preferably 10 to 30.

The BET specific surface area of the metal flake can be selected from the range of approximately from 0.3 to 7 $m^2/g$ and may be, for example, approximately 0.5 to 6 $m^2/g$, preferably 1 to 5 $m^2/g$, and more preferably 1.2 to 4 $m^2/g$, and may be usually approximately 1 to 5 $m^2/g$.

The tap density of the metal flake can be selected from the range of approximately from 0.1 to 7 $g/cm^3$ (e.g., 0.2 to 6 $g/cm^3$) and may be, for example, approximately 0.3 to 5 $g/cm^3$, preferably 0.5 to 4.5 $g/cm^3$, and more preferably 1 to 4 $g/cm^3$, and may be usually approximately 1.2 to 4 $g/cm^3$ (e.g., 1.5 to 3.5 $g/cm^3$).

(Metal Particles)

In the composition of the present invention, in order to control conductivity and fluidity, the metal flake may be used in combination with metal particle having the X value of larger than 20%. By the combination with the metal particle, the conductivity and fluidity of the paste can be controlled. The form of the metal particle may be a particle having an X value of larger than 20% and may be a spherical shape, a fibrous shape or the like. Incidentally, the metal forming the metal particle is the same as described above and may be the same or different from that of the metal flake. The metal particle may be used singly or in combination of two or more thereof. Incidentally, as the metal particle, commercially available products may be used or the metal particle may be prepared by a conventional method.

Incidentally, the ratio (proportion) of the average particle diameter of the metal flake to the average particle diameter of the metal particle may be, for example, the former/the latter=2/1 to 1,000/1 (e.g., 3/1 to 500/1), preferably approximately 4/1 to 300/1 (e.g., 5/1 to 200/1), and more preferably 10/1 to 100/1. The average particle diameter of the metal particle can be measured also by utilizing, for example, a laser diffraction scattering particle size distribution measuring method or the like.

The ratio of the metal flake to the metal particle (spherical metal particle) can be selected from the range of the former/the latter (weight ratio)=approximately 100/0 to 5/95 (e.g., 99/1 to 10/90) and may be, for example, approximately 95/5 to 25/75 (e.g., 90/10 to 30/70), and preferably approximately 85/15 to 40/60 (e.g., 80/20 to 45/55), and may be approximately 99/1 to 30/70.

(Resin Component)

In the present invention, the resin component constituting the conductive composition has an aromatic amine skeleton (or a skeleton derived from an aromatic amine). By combining the metal flake with the resin component having an aromatic amine skeleton, high conductivity can be realized and sufficient close contact to a base material can be secured. The reason therefor is not clear but, there are cases where the resin component having an aromatic amine skeleton promotes the contact and sintering (formation of metal bonds) among the metal flakes and it is also assumed that good compatibility of the resin structure having a rigid aromatic amine skeleton formed after curing or solidification with a rigid metal network structure formed of the metal flake.

The resin component having an aromatic amine skeleton is sufficiently a resin component having an aromatic amine skeleton or residue (in particular, a skeleton or residue of an aromatic polyamine including an aromatic diamine) in a state of being cured or solidified, and includes (a) a resin using an aromatic amine (in particular, an aromatic polyamine including an aromatic diamine) as a reaction component (polymerization component or modification (or denaturation) component) and (b) a resin composition containing a resin and a component reactive with the resin (e.g., a curing agent reactive with a thermosetting resin (e.g., a curing agent including an aromatic amine (in particular, an aromatic polyamine including an aromatic diamine)-based curing agent)).

The resin (a) described above contains an aromatic amine skeleton or residue according to the embodiment of the resin and the amino group of the aromatic amine may form a free amino group (or imino group).

The resin (a) may be either a thermoplastic resin or a thermosetting resin. Examples of the thermoplastic resin include a resin containing an aromatic amine as a polymerization component (or a monomer) (e.g., a polyamide resin using a diamine component including an aromatic diamine (an aromatic amine-based curing agent to be mentioned later, etc.); an addition polymerization resin (a (meth)acrylic resin, etc.) using a radical polymerizable monomer having an aromatic amine skeleton (e.g., 2-ethylaminophenyl (meth)acrylate, 4-(benzoylamino)phenyl (meth)acrylate, etc.) as a polymerization component; etc.) and the like. Moreover, the thermoplastic resin may be a resin obtained by modifying or denaturing a thermoplastic resin having reactivity to an amino group with an aromatic amine (in particular, an aromatic polyamine). Examples of the thermoplastic resin having reactivity to an amino group include a resin having a carboxyl group (a (meth)acrylic homopolymer or copolymer using a carboxyl group-containing polymerizable monomer such as a (meth)acrylic acid as a polymerization component, a polyester resin having a carboxyl group or an acid anhydride group, etc.), a resin having an epoxy group (a (meth)acrylic homopolymer or copolymer using a glycidyl (meth)acrylate as a polymerization component, etc.), a resin having an isocyanate group (a urethane-based resin, etc.), and the like. These thermoplastic resins may be used singly or in combination of two or more thereof.

A preferable resin (a) is a thermosetting resin and, examples of the thermosetting resin include a resin using an aromatic amine (an aromatic polyamine such as a diamine) as a polymerization component (or a monomer), for example, a glycidylamine type aromatic epoxy resin, an aniline resin, a phenol resin (a phenol resin obtained by co-condensation of an aromatic amine such as aniline, etc.), an amino resin (an amino resin obtained by co-condensation of an aromatic amine such as aniline, etc.), and the like.

Furthermore, the resin component having an aromatic amine skeleton is preferably the resin composition (b) and the resin of the resin composition (b) is preferably a thermosetting resin. That is, the resin composition (b) contains a thermosetting resin (or a thermosetting resin precursor) and a curing agent (or a crosslinking agent), and the thermosetting resin and/or the curing agent contain an aromatic amine skeleton. In particular, it is preferred that the thermosetting resin composition is composed of a thermosetting resin and a curing agent containing an aromatic amine-based curing agent. In the case where the aromatic amine-based curing agent is used, it is possible to realize high conductivity more efficiently. The reason therefor is not clear but, it is assumed that the conductivity is improved by the interaction between the metal flake and the aromatic amine skeleton.

In the case where the resin exemplified in the resin (a) is used as the thermosetting resin of the resin composition (b), as the curing agent, there may be exemplified a conventional curing agent having reactivity to an amino group, for example, an acid anhydride-based curing agent, an isocyanate-based curing agent, or the like. Examples of the thermosetting resin of the resin composition (b) include, in addition to the resins exemplified in the above resin (a), an epoxy resin, a phenolic resin, a polyurethene resin (a polyisocyanate resin having an isocyanate group), a (meth)acrylic resin or styrene-based resin (a (meth)acrylic resin or styrene-based resin having a carboxyl group, acid anhydride group, a glycidyl group, or an isocyanate group, etc.), a polyimide resin (polyamic acid having an acid anhydride group, etc.), and the like. These thermosetting resins can be used singly or in combination of two or more thereof. In this case, as the curing agent, a curing agent containing an aromatic amine-based curing agent to be mentioned later is used. For example, the resin composition (b) may be a polyisocyanate resin composition containing a polyisocyanate compound (or a polyisocyanate resin having an isocyanate group) and a curing agent (containing an aromatic amine-based curing agent) and may also be an epoxy resin composition containing an epoxy resin and a curing agent (containing an aromatic amine-based curing agent).

Incidentally, in the case where the resin component having an aromatic amine skeleton is the resin (a), the ratio of the aromatic amine skeleton (skeleton derived from the aromatic amine) may be, for example, approximately 1% by weight or more (e.g., 2 to 100% by weight), preferably 3% by weight or more (e.g., 5 to 90% by weight), and more preferably 5% by weight or more (e.g., 10 to 80% by weight) of the entire resin component.

In the case where the resin component having an aromatic amine skeleton is the resin composition (b), the ratio of the aromatic amine skeleton to the entire resin component (e.g., the ratio of the aromatic amine-based curing agent) may be approximately 1% by weight or more (e.g., 2 to 80% by weight), preferably 5 to 50% by weight, and more preferably 10 to 30% by weight of the entire resin component. Incidentally, the ratio of the aromatic amine-based curing agent may be, for example, relative to 100 parts by weight of the thermosetting resin, approximately 0.1 to 500 parts by weight, preferably 1 to 300 parts by weight, more preferably 3 to 150 parts by weight, and particularly 5 to 100 parts by weight.

Hereinafter, as a preferable thermosetting resin composition, a resin composition containing an epoxy resin as a main agent and containing an aromatic amine-based curing agent as a curing agent will be described in detail.

(Epoxy Resin)

The epoxy resin usually contains at least a polyfunctional epoxy resin. The polyfunctional epoxy resins may be any of, for example, glycidyl ether type, glycidyl amine type, glycidyl ester type, alicyclic type, and the like. The polyfunctional epoxy resin may be an aliphatic epoxy resin, an alicyclic epoxy resin, an aromatic epoxy resin, a nitrogen-containing type epoxy resin (a nitrogen-containing type polyfunctional epoxy resin, e.g., triglycidyl isocyanurate, etc.), and the like. In the polyfunctional epoxy resin, the number of epoxy groups in the molecule may be, for example, approximately 2 to 150 (e.g., 2 to 100), preferably 2 to 80 (e.g., 2 to 50), and more preferably 2 to 30, depending on the kind of the epoxy resin. The epoxy resins may be used singly or in combination of two or more thereof.

Of the aliphatic epoxy resins, examples of the diglycidyl ether type epoxy resin include alkanepolyol polyglycidyl ethers (di- to hexa-glycidyl ethers of alkane polyols selected from alkanediols such as butanediol and neopentyl glycol; poly-$C_{2-4}$-alkanediols such as polyethylene glycol and polypropylene glycol; and alkane-tri- to hexa-ols such as trimethylolpropane, glycerin and pentaerythritol, etc.), cyclohexanedimethanol diglycidyl ether, and the like. Examples of the glycidyl ester type epoxy resin include cycloalkanedicarboxylic acids (1,2-cyclohexanedicarboxylic acid, 1,3-cyclohexanedicarboxylic acid, 1,4-cyclohexanedicarboxylic acid, etc.), dimer acid glycidyl ester, and the like.

Examples of the alicyclic epoxy resin include esters of an alkanepolyol with an epoxycycloalkanecarboxylic acid (e.g., 3,4-epoxycyclohexylmethyl-3,4-epoxycyclohexanecarboxylate; a triester of 2,2-bis(hydroxymethyl)-1-butanol with 3,4-epoxycyclohexanecarboxylic acid; etc.) and the like.

The aromatic epoxy resin includes a glycidyl ether type aromatic epoxy resin, a glycidyl ester type aromatic epoxy resin, and a glycidyl amine type aromatic epoxy resin.

Examples of the glycidyl ether type aromatic epoxy resin include arene glycidyl ethers (e.g., diglycidyloxybenzenes, diglycidyloxynaphthalenes (e.g., polyglycidyloxynaphthalenes such as 2,6-di(glycidyloxy)naphthalene and 2,7-di(glycidyloxy)naphthalene), 4,4'-diglycidyloxybiphenyl, and 2,2'-diglycidyloxybinaphthalene, etc.); bisphenol type epoxy resins; novolak type epoxy resins, and the like.

Examples of the bisphenol type epoxy resin include diglycidyl ethers of bisphenols or alkylene oxide (e.g., $C_{2-4}$-alkylene oxide such as ethylene oxide and propylene oxide) adducts thereof. Examples of the bisphenols include bi(hydroxyarene)s such as biphenol and binaphthol; bis(hydroxyphenyl)-$C_{1-10}$alkanes such as bisphenol A, bisphenol B, bisphenol E, and bisphenol F; bis($C_{1-10}$-alkyl-hydroxyphenyl)-$C_{1-10}$-alkanes such as 2,2-bis(3-methyl-4-hydroxyphenyl)propane and bisphenol G; bis(hydroxy-$C_{6-10}$-arylphenyl)-$C_{1-10}$-alkanes such as bisphenol PH; bis(hydroxyphenyl)-$C_{5-10}$-cycloalkanes such as bisphenol Z and bisphenol TMC; bisphenol AP, bisphenol BP; bisphenol AF; bisphenol S; bisphenol M; bisphenol P; bisnaphthols (e.g., bis(hydroxynaphthyl)-$C_{1-10}$-alkanes such as 1,1'-methylenebis(hydroxynaphthalene); and the like. In the alkylene oxide adducts of bisphenols, the molar number of added alkylene oxide per 1 mole of the hydroxyl groups of the bisphenols may be, for example, approximately 1 mol or more (e.g., 1 to 20 mol), preferably 1 to 15 mol, and more preferably 1 to 10 mol.

Examples of the novolak type epoxy resin include glycidyl ethers of novolak resins using a phenol as a polymerization component. Examples of the phenol include phenol; substituted phenols such as alkylphenols (e.g., $C_{1-12}$-alkylphenols, preferably $C_{1-4}$-alkylphenol, such as cresol, ethylphenol, s-butylphenol, t-butylphenol, decylphenol, and dodecylphenol), and aralkylphenols (e.g., $C_{6-10}$-aryl-$C_{1-10}$-alkylphenols such as 1,1-dimethyl-1-phenylmethylphenol); naphthols (e.g., naphthol, etc.), bisphenols (bisphenols exemplified above), and the like. These phenols may constitute novolak resin(s) singly or in combination of two or more thereof.

Examples of typical novolak type epoxy resins include phenol novolak type epoxy resins, alkylphenol novolak type epoxy resins (e.g., cresol novolak type epoxy resins, etc.), naphthol novolak type epoxy resins, bisphenol novolak type epoxy resins (e.g., bisphenol A novolak type epoxy resins, bisphenol F novolak type epoxy resin, etc.), modified novolak type epoxy resins (e.g., aralkyl novolak type epoxy resins (e.g., xylylene skeleton-containing phenol novolak resins etc.), dicyclopentadiene skeleton-containing novolak type epoxy resins (e.g., dicyclopentadiene skeleton-containing phenol novolak type epoxy resins), biphenyl skeleton-containing novolak type epoxy resins (e.g., biphenyl skeleton-containing phenol novolak type epoxy resins), and brominated novolak type epoxy resins (e.g., brominated phenol novolak type epoxy resins), etc.), and the like.

Incidentally, the number average molecular weight of the novolak type epoxy resin may be, for example, approximately 1,000 to 1,000,000, preferably 2,000 to 100,000, and more preferably 3,000 to 25,000.

Examples of the glycidyl ester type aromatic epoxy resins include diglycidyl esters of aromatic dicarboxylic acids (phthalic acid, isophthalic acid, terephthalic acid, naphthalenedicarboxylic acid, etc.) and the like.

Examples of the glycidylamine type aromatic epoxy resin include N,N-glycidylaniline; tetra- to octa-glycidylpolyamines such as tetraglycidyl diaminodiphenylmethane and tetraglycidyl-m-xylylenediamine; triglycidyl-p-aminophenol; N,N-diglycidyl-4-glycidyloxyaniline (or N,N-bis(2,3-epoxypropyl)-4-(2,3-epoxypropoxy)aniline), and the like.

The epoxy equivalent of the epoxy resin is not particularly limited and can be selected from the range of approximately 800 g/eq or less (e.g., 50 to 750 g/eq), and may be, for example, approximately 700 g/eq or less (e.g., 70 to 650 g/eq), preferably 600 g/eq or less (e.g., 80 to 550 g/eq), and particularly 500 g/eq or less (e.g., 100 to 450 g/eq).

The epoxy resin may be a monofunctional epoxy resin. The monofunctional epoxy resin is frequently used as a reactive diluent. Examples of the monofunctional epoxy resin include glycidyl ethers (e.g., aromatic monoglycidyl ethers such as phenyl glycidyl ether and o-phenylphenyl glycidyl ether), cycloalkene oxides (e.g., 4-vinylepoxycyclohexane, epoxyhexahydrophthalic acid dialkyl esters, etc.), and the like.

Incidentally, the ratio of the polyfunctional epoxy resin to the monofunctional epoxy resin can be selected from the range of the former/the latter (weight ratio)=approximately 100/0 to 30/70 and may be, for example, approximately 99/1 to 40/60 (e.g., 97/3 to 50/50), and preferably 95/5 to 60/40 (e.g., 95/5 to 70/30).

(Aromatic Amine-Based Curing Agent)

Examples of the aromatic amine-based curing agent include aromatic polyamines such as diamines, for example, diamino-$C_{6-10}$-arenes such as p-phenylenediamine and m-phenylenediamine; diamino-mono- to tri-$C_{1-4}$-alkyl-$C_{6-10}$-arenes such as toluenediamine; and di(amino-$C_{1-4}$- alkyl)-$C_{6-10}$-arenes such as xylylenediamine, and also aromatic polyamines (bisarylpolyamines) represented by the following formula (1) and the like may be exemplified.

[Chem. 2]

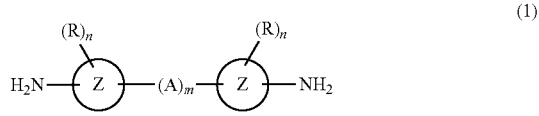

(1)

(in the formula, rings Z each independently represents an arene ring, A represents an alkylene group or alkylidene group, a cycloalkylene group or cycloalkylidene group, an arylene group, an oxygen atom, a sulfur atom, a sulfinyl group, or a sulfonyl group, R represents an alkyl group, a cycloalkyl group, an aryl group, an aralkyl group, an alkoxy group, or a halogen atom, m represents 0 or 1, and n's each independently represents an integer of from 0 to 4.)

Examples of the arene ring represented by the ring Z include $C_{6-10}$-arene rings such as a benzene ring and a naphthalene ring. The ring Z is a benzene ring in many cases. Examples of the alkylene group or alkylidene group represented by A include linear or branched $C_{1-6}$-alkylene groups or alkylidene groups, such as a methylene group, an ethylene group, an ethylidene group, a propylene group, a 2-propylidene group, and a 2-butylidene group. These alkylene groups or alkylidene groups may be substituted with an aryl group (a $C_{6-10}$-aryl group such as a phenyl group), a halogen atom, or the like. Examples of the cycloalkylene group or cycloalkylidene group include $C_{4-10}$-cycloalkylene groups or cycloalkylidene groups, such as 1,4-cyclohexylene group and a cyclohexylidene group, and the like. Examples of the arylene group include $C_{6-10}$-arylene groups such as a phenylene group, 4,4'-biphenylene group, a fluorene-9,9-diyl group, and the like. A may be an oxygen atom or an ether group (—O—), a sulfur atom or a thio group (—S—), a sulfinyl group (—SO—), or a sulfonyl group (—$SO_2$—).

The coefficient m is 0 or 1 and the compound where m is 0 forms a biaryl compound.

Examples of the alkyl group represented by R include $C_{1-6}$-alkyl groups such as a methyl group and an ethyl group. Examples of the cycloalkyl group include $C_{5-8}$-cycloalkyl groups such as cyclohexyl group; examples of the aryl group include $C_{6-10}$-aryl groups such as a phenyl group; and, examples of the aralkyl group include $C_{6-8}$-aryl-$C_{1-2}$-alkyl groups such as a benzyl group. Examples of the alkoxy group include $C_{1-6}$-alkoxy groups such as a methoxy group, an ethoxy group and a butoxy group. The halogen atom includes fluorine, chlorine, and bromine atoms, and the like. Preferable R is an alkyl group (a $C_{1-4}$-alkyl group such as a methyl group). Incidentally, in the case where a plurality of substituents R are present, the kind of the substituents R may be the same or different from each other.

The coefficient n can be selected from integers of from 0 to 4 and may be usually 0 to 2 (e.g., 1 or 2).

Incidentally, in the case where the ring Z is a benzene ring, the amino group is bonded to $3^{rd}$-position or $4^{th}$-position (particularly, $4^{th}$-position) in many cases and the substituent R is bonded to $3^{rd}$-position, $4^{th}$-position, and/or $5^{th}$-position (particularly, $3^{rd}$-position and/or $5^{th}$-position) in many cases.

Examples of the bisarylpolyamine represented by the above formula (1) include diaminobiarenes (4,4'-diaminobiphenyl etc.); bis(aminoaryl)alkanes (e.g., di(amino-$C_{6-10}$-aryl)-$C_{1-6}$-alkanes such as di(4-aminophenyl)methane); bis (amino-alkylaryl)alkanes (e.g., di(amino-$C_{1-4}$-alkyl-$C_{6-10}$-aryl)-$C_{1-6}$-alkanes such as bis(3-ethyl-4-aminophenyl) methane and bis(3-ethyl-5-methyl-4-aminophenyl) methane); bis(aminoaryl) ethers (e.g., di(amino-$C_{6-12}$-aryl) ethers, preferably di(amino-$C_{6-10}$-aryl) ethers, such as diaminodiphenyl ether, etc.); bis(aminoaryl) sulfides (e.g., di(amino-$C_{6-12}$-aryl) sulfides, preferably di(amino-$C_{6-10}$-aryl) sulfides, such as diaminodiphenyl sulfide, etc.); bis (aminoaryl) sulfones (e.g., di(amino-$C_{6-12}$-aryl) sulfones, preferably di(amino-$C_{6-10}$-aryl) sulfones, such as diaminodiphenyl sulfone, etc.); bis(aminoarylalkyl)arenes (e.g., bis (amino-$C_{6-10}$-aryl-$C_{1-10}$-alkyl)-$C_{6-10}$-arenes such as 1,3-bis [2-(4-aminophenyl)-2-propyl]benzene and 1,4-bis[2-(4-aminophenyl)-2-propyl]benzene, etc.); di(aminoaryloxy) arenes (e.g., di(amino-$C_{6-12}$-aryloxy)-$C_{6-12}$-arenes, preferably di(amino-$C_{6-10}$-aryloxy)-$C_{6-10}$-arenes, such as 1,3-bis(3-aminophenoxy)benzene); and the like.

These aromatic amine-based curing agents may be used singly or in combination of two or more thereof. As preferable curing agents, there may be exemplified bisphenol-based polyamines, particularly, compounds represented by the formula (1), for example, aromatic amines in which an amino group is directly substituted on an aromatic ring (e.g., poly(aminoaryl)alkanes, di(aminoaryl) ethers, di(aminoaryl) sulfones, etc.) and the like.

Incidentally, the aromatic amine-based curing agent may be combined with the other curing agent, if necessary. Examples of the other curing agent include aliphatic amine-based curing agents (e.g., (poly)alkylenepolyamines such as ethylenediamine, hexamethylenediamine, diethylenetriamine, triethylenetetramine, tetraethylenepentamine, and diethylaminopropylamine, etc.), alicyclic amine-based curing agents (e.g., monocyclic aliphatic polyamines such as menthenediamine, isophoronediamine, bis(4-amino-3-methylcyclohexyl)methane, and 3,9-bis(3-aminopropyl)-2,4,8,10-tetraoxaspiro[5.5]undecane; crosslinked cyclic polyamines such as norbornanediamine; etc.), imidazole-based curing agents (imidazoles (e.g., alkylimidazoles such as 2-methylimidazole, 2-heptadecylimidazole and 2-ethyl-4-methylimidazole; and arylimidazoles such as 2-phenylimidazole, 2-phenyl-4-methylimidazole, 2-phenyl-4-methyl-5-hydroxymethylimidazole, and 1-benzyl-2-phenylimidazole), salts of imidazoles (e.g., organic salts such as formate salts, phenol salts, and phenol novolak salts; salts such as carbonate salts), reaction products (or adducts) of an epoxy compound (e.g., a polyepoxy compound such as diglycidyl ether of bisphenol A) with an imidazole, etc.), phenol resin-based curing agents (e.g., novolak resins exemplified in the section of the novolak type epoxy resins described above, etc.), acid anhydride-based curing agents (e.g., aliphatic carboxylic acid anhydrides such as dodecenylsuccinic anhydride and adipic anhydride; alicyclic carboxylic acid anhydrides such as tetrahydrophthalic anhydride, methyltetrahydrophthalic anhydride, hexahydrophthalic anhydride, methylhexahydrophthalic anhydride, methylhimic anhydride, and methylcyclohexenedicarboxylic acid anhydride; aromatic carboxylic acid anhydrides such as phthalic anhydride, trimellitic anhydride, pyromellitic anhydride, and benzophenonetetracarboxylic acid anhydride), polyaminoamide-based curing agents, polymercaptan-based curing agents, latent curing agents (boron trifluoride-amine complexes, dicyandiamide, carboxylic acid hydrazide, etc.), and the like. These curing agents may be used singly or in combination of two or more thereof. Incidentally, the curing agent may also act as a curing accelerator in some cases.

Incidentally, the ratio of the aromatic amine-based curing agent to the other curing agent can be selected from the range of the former/the latter (weight ratio)=approximately 100/0 to 30/70 and may be approximately 99.5/0.5 to 40/60 (e.g., 99/1 to 50/50), and preferably 98/2 to 70/30 (e.g., 97/3 to 80/20).

Moreover, the ratio of the curing agent (or the aromatic amine-based curing agent) may be, for example, relative to 100 parts by weight of the epoxy resin, approximately 1 to 200 parts by weight, preferably 2 to 150 parts by weight, and more preferably 3 to 100 parts by weight, and may be usually approximately 5 to 80 parts by weight (e.g., 10 to 60 parts by weight).

Incidentally, relative to 1 equivalent of the epoxy group in the epoxy resin, the ratio of the functional group (amino group or the like) of the curing agent may be, for example, approximately 0.1 to 4.0 equivalents, preferably 0.3 to 2.0 equivalents, and more preferably 0.5 to 1.5 equivalents.

The epoxy resin composition may contain a curing accelerator. Examples of the curing accelerator include conventional curing accelerators, for example, phosphines (e.g., ethylphosphine, propylphosphine, phenylphosphine, triphenylphosphine, trialkylphosphines, etc.), amines (e.g., secondary to tertiary amines such as piperidine, triethylamine, benzyldimethylamine, triethanolamine, dimethylaminoethanol, triethylenediamine, tris(dimethylaminomethyl)phenol, and N,N-dimethylpiperazine, or salts thereof, etc.), and the like. Incidentally, the curing agents exemplified above (e.g., imidazoles etc.) may also function as a curing accelerator in some cases. The curing accelerators may be used singly or in combination of two or more thereof.

The ratio of the curing accelerator may be, for example, relative to 100 parts by weight of the epoxy resin, approximately 0.01 to 50 parts by weight, and preferably 0.1 to 30 parts by weight, and may be usually approximately 0.5 to 30 parts by weight (e.g., 1 to 25 parts by weight).

The ratio of the resin component having an aromatic amine skeleton (e.g., the epoxy resin composition, etc.) may be, for example, relative to 100 parts by weight of the metal flake, approximately 1 to 50 parts by weight (e.g., 2 to 40 parts by weight), preferably 3 to 30 parts by weight (e.g., 4 to 25 parts by weight), and more preferably 5 to 20 parts by weight (e.g., 5 to 15 parts by weight), and may be usually approximately 3 to 15 parts by weight (e.g., 5 to 10 parts by weight). In the present invention, by combining the metal flake with the specific resin component, it is possible to improve conductivity and close contact even in the case where the ratio of the resin component is large.

(Other Components)

To the conductive composition of the present invention, if necessary, there may be added conventional additives, for example, colorants (dyes, pigments, etc.), hue-improving agents, dye-fixing agents, metal corrosion inhibitors, stabilizers (antioxidants, ultraviolet absorbers, etc.), surfactants or dispersing agents, dispersion stabilizers, thickeners or viscosity modifiers, thixotropy-imparting agents, leveling agents or gloss-imparting agents, humectants, defoamers, fungicides, fillers, and the like. These additives can be used singly or in combination of two or more thereof.

Moreover, the conductive composition of the present invention may contain a solvent (or a dispersion medium). Such a composition (particularly, a paste composition) is suitable as a coating composition (conductive composition for coating). Examples of the solvent include alcohols (e.g., aliphatic alcohols such as ethanol, propanol, isopropanol, butanol, 2-ethyl-1-hexanol, and decanol; alicyclic alcohols, e.g., cycloalkanols (cyclohexanol, etc.), terpene alcohols such as terpineol and dihydroterpineol; aralphatic alcohols such as benzyl alcohol; polyhydric alcohols ((poly)alkanepolyols such as ethylene glycol, propylene glycol, diethylene glycol, and dipropylene glycol, etc.)), glycol ethers (e.g., cellosolves such as ethylene glycol monomethyl ether (methyl cellosolve), ethyl cellosolve, and butyl cellosolve; carbitols such as diethylene glycol monomethyl ether (methyl carbitol), ethyl carbitol, propyl carbitol, and butyl carbitol; polyethylene glycol mono-$C_{1-6}$-alkyl ethers such as triethylene glycol monomethyl ether, triethylene glycol monoethyl ether, triethylene glycol monobutyl ether, and tetraethylene glycol monobutyl ether, etc.); glycol ether esters (e.g., cellosolve acetates and carbitol acetates, etc.), hydrocarbons (e.g., aliphatic hydrocarbons (e.g., hexane, octane, etc.), alicyclic hydrocarbons (cyclohexane etc.), halogenated hydrocarbons (methylene chloride, chloroform, dichloroethane, etc.), aromatic hydrocarbons (e.g., toluene, xylene, etc.), etc.), esters (e.g., methyl acetate, ethyl acetate, etc.), amides (N,N-dimethylformamide, N,N-dimethylacetamide, etc.), ketones (acetone, methyl ethyl ketone, methyl isobutyl ketone, etc.), ethers (diethyl ether, dipropyl ether, dioxane, tetrahydrofuran, etc.), and the like. These solvents may be used singly or in combination of two or more thereof.

Incidentally, in the conductive composition (or conductive paste) containing a solvent, the concentration of solid matter may be selected from the range of, for example, approximately from 10 to 99% by weight, and is, for example, 20 to 95% by weight, preferably 30 to 90% by weight (e.g., 50 to 90% by weight), and more preferably 60 to 85% by weight, and may be usually approximately 50 to 90% by weight (e.g., 60 to 80% by weight).

The viscosity of the conductive composition (particularly, the conductive composition containing a solvent) of the present invention may be, for example, at 25° C., approximately 1 to 500 Pa·s (e.g., 3 to 300 Pa·s), preferably 5 to 250 Pa·s (e.g., 7 to 200 Pa·s), and more preferably 10 to 150 Pa·s. In the case where the viscosity is too small, there is a concern of dripping at the time of application (e.g., dispensing application), and in the case where the viscosity is too large, there is a concern that stringing occurs.

Incidentally, the conductive composition of the present invention can be prepared by mixing individual components and, for example, it may be prepared by dispersing a metal flake in a system containing a resin component (and other component(s), as needed) and a solvent (or a dispersing medium).

(Use Applications of Conductive Composition and Molded Body)

The conductive composition (or conductive paste) of the present invention is useful for forming various molded bodies (conductive molded bodies) that require to have conductivity (or a conductive portion). For example, the conductive composition of the present invention can be utilized as a composition for forming wiring or circuits (electrically conducting paths or electrodes) on a base material. In particular, since the conductive composition of the present invention can realize high conductivity and thermal conductivity and also is excellent in close contact or adhesiveness to a base material, it is suitable as a conductive adhesive.

That is, the conductive molded body has at least a conductive portion (or a conductive film) formed of the conductive composition of the present invention. More specifically, in wiring or circuit applications, the conductive molded body can utilize the conductive portion formed of the conductive composition on a base material as wiring or circuits (or electrodes). Furthermore, in the conductive adhesive applications, the conductive molded body contains a conjugated base material (a conjugated member) composed of two base materials and a conductive adhesive that intervenes between the base materials and bonds the two base material (direct bonding), and the conductive adhesive is formed of the conductive composition.

Such a molded body can be obtained by applying (or coating) the conductive composition on a base material and subjecting it to a solidifying or curing treatment. Usually, the conductive composition many be formed on an adhesive layer that is formed on a base material or may be directly applied on the base material without forming another adhesive layer or the like.

The base material (or substrate) may be made of an inorganic material (inorganic raw material) and/or an organic material (organic raw material). Examples of the inorganic material include glasses (soda glass, borosilicate glass, crown glass, barium-containing glass, strontium-containing glass, boron-containing glass, low alkali glass, alkali-free glass, transparent crystallized glass, silica glass, quartz glass, heat-resistant glass, etc.), ceramics, metals (aluminum, copper, gold, silver, etc.), semiconductors (e.g., semiconductors formed of conductors, semiconductors, insulators, etc., etc.). Examples of the ceramics include metal oxides (silicon oxide, quartz, alumina or aluminum oxide, zirconia, sapphire, ferrite, titania or titanium oxide, zinc oxide, niobium oxide, mullite, beryllia, etc.), metal nitrides (aluminum nitride, silicon nitride, boron nitride, carbon nitride, titanium nitride, etc.), metal carbides (silicon carbide, boron carbide, titanium carbide, tungsten carbide, etc.), metal borides (titanium boride, zirconium boride, etc.), metal complex oxides (titanate metal salts (barium titanate, strontium titanate, lead titanate, niobium titanium, calcium titanium, magnesium titanate, etc.), zirconate metal salts (barium zirconate, calcium zirconate, lead zirconate, etc.), etc.), and the like.

Examples of the organic material include polymethyl methacrylate-based resins, styrene-based resins, vinyl chloride-based resins, polyester-based resins (including polyalkylene arylate-based resins (homo- or co-polyalkylene arylates such as polyethylene terephthalate, polybutylene terephthalate, and polyethylene naphthalate, etc.), polyarylate resins, and liquid crystal polymers), polyamide-based resins, polycarbonate-based resins, polysulfone-based resins, polyethersulfone-based resins, polyimide-based resins, cellulose derivatives, fluorocarbon resins, and the like.

Of these materials, preferred are materials having high heat resistance, for example, inorganic materials such as semiconductors, glass and metals, and plastics such as engineering plastics (e.g., aromatic polyester-based resins (polyalkylene arylate-based resins such as polyethylene naphthalate, polyarylate-based resins, etc.), polyimide-based resin, polysulfone-based resin, etc.), liquid crystal polymers, and fluorocarbon resin.

Incidentally, the conductive adhesive formed of the conductive composition may bond the same or different two base materials each other. For example, it may bond a metal base material and another metal base material, and may bond a metal base material and a semiconductor base material. In the case of bonding metals each other, a metal or ceramic film (metal film or metal oxide film, etc., formed by vapor deposition, etc.) formed on a non-metallic base material (e.g., a semiconductor, a plastic, etc.) may be bonded. As more specific examples, for example, in the semiconductor field, a lead frame (e.g., a lead frame formed of a metal (copper, a copper alloy, aluminum, etc.), a lead frame formed of a metal and further subjected to a plate processing, etc.) as one base material and a semiconductor substrate (or a semiconductor chip) (e.g., a semiconductor base material (a silicon substrate, etc.), a semiconductor chip in which a metal film (titanium, platinum, gold, etc.), circuit and/or a conductive film (ITO film, etc.) such as an electrode are formed on a semiconductor base material (a silicon substrate, etc.), etc.) as another base material may be bonded each other by the conductive adhesive (die bond paste).

The surface of the base material may be subjected to a surface treatment such as an oxidation treatment (a surface oxidation treatment, e.g., a discharge treatment (a corona discharge treatment, a glow discharge, etc.), an acid treatment (a chromic acid treatment, etc.), an ultraviolet irradiation treatment, a flame treatment, etc.), and a surface roughening treatment (a solvent treatment, a sand blasting treatment, etc.), and the like.

The thickness of the base material may be appropriately selected depending on the use application, and may be, for example, approximately 0.001 to 10 mm, preferably 0.01 to 5 mm, and more preferably 0.05 to 3 mm.

Examples of the coating method of the conductive composition to a base material include, for example, a flow coating method, a spin coating method, a spray coating method, a casting method, a bar coating method, a curtain coating method, a roll coating method, a dipping method, a slit method, a photolithography method, various printing methods (a screen printing method, a flexographic printing method, a gravure coating method, an inkjet method), and the like. The conductive composition can be applied, depending on the use application, at least a part (a part or all) of the entire surface of the base material. For example, in the case of forming wiring or a circuit, the coating film of the conductive composition may be formed in a pattern shape; and in the case of the use as a conductive adhesive, a coating film of the conductive composition may be formed corresponding to the portion to be bonded between the two base materials. In the case of forming a coating film in a pattern shape, for example, coating may be performed by utilizing a screen printing method, an inkjet printing method, an intaglio printing method (e.g., a gravure printing method, etc.), an offset printing method, an intaglio offset printing method, a flexographic printing method, or the like.

After coating, it may be air-dried or may be dried by heating. The heating temperature can be selected depending on the type of a solvent and is, for example, approximately 50 to 200° C., preferably 80 to 180° C., and more preferably 100 to 150° C. (particularly, 110 to 140° C.). The heating time is, for example, approximately 1 minute to 3 hours, preferably 5 minutes to 2 hours, and more preferably 10 minutes to 1 hour.

The coating film in an uncured (precursor) state is usually subjected to a curing treatment. Usually, the curing treatment can be carried out, at least, by heating (or firing or a heat treatment). The heating temperature (heat treatment temperature) may be, for example, approximately 100 to 350° C., preferably 120 to 320° C. and more preferably 150 to 300° C. (e.g., 180 to 250° C.). The heating time may be, depending on the heating temperature or the like, for example, approximately 10 minutes to 5 hours, preferably 15 minutes to 3 hours, and more preferably 20 minutes to 1 hour.

The thickness of the resulting conductive portion or conductive film (coating film after the curing treatment, sintered pattern) can be appropriately selected from the range of approximately from 0.01 to 10,000 μm depending on the use application, and may be, for example, approximately 0.01 to 100 preferably 0.1 to 50 μm, more preferably 0.3 to 30 μm (particularly, 0.5 to 10 μm). In the present invention, a metal film of a relatively thick film, for example, having a thickness of approximately 0.3 μm or more (e.g., 0.3 to 100 μm), preferably 0.5 μm or more (e.g., 0.5 to 50 μm) and more preferably 1 μm or more (e.g., 1 to 30 μm) may be formed. Even in the case of such a thick film, a high-conductive film can be formed without impairing close contact to a base material.

In the conductive molded body of the present invention, the value X of the conductive portion intervening between the base materials may be 30% or less (e.g., 25% or less, preferably 10% or less, more preferably 5% or less, and particularly 3% or less). In the present invention, as the value X, it is possible to adopt a value measured on the side coming into contact with the base material (on the base material side) or on the front surface side. Incidentally, although the value X of the conductive portion slightly varies depending on the measured portion (portion in a thickness direction) in some cases, even in such cases, the value X falls within the above range in many cases. For example, the value X measured on the front surface side of a thin film (e.g., a thin film having a thickness of approximately from 200 to 400 μm) is 10% or less, preferably 5% or less (e.g., 0.5 to 3%), and more preferably 3% or less (e.g., 1 to 2.5%). Moreover, in the case where the thickness of the conductive portion increases, there is shown a tendency that the value X increases with a decrease in orientation at a central part (inside apart from the front surface part) of the conductive portion. For example, the value X of the inside (measuring face cut in the vicinity of the central part in a thickness direction) of the conductive portion (conductive film) of a thick film having a thickness of approximately 5 mm may exceed 30% but may be usually approximately 30% or less (e.g., 5 to 27%), and preferably 25% or less (e.g., 20 to 25%).

EXAMPLES

The following will describe the present invention in more detail based on Examples, but the present invention is not limited by these Examples. Various components used in Examples and Comparative Examples are as follows.
(Aromatic Amine Resin Component A)
An aromatic amine resin component A was prepared by mixing 1.25 parts by weight of an aromatic polyamine (manufactured by Tokyo Chemical Industry Co., Ltd., 4,4'-methylenebis(2-ethyl-6-methylaniline)) with 3.75 parts by weight of bisphenol A propoxy diglycidyl ether (manufactured by Wako Pure Chemical Industries, Ltd., epoxy equivalent: 228 g/eq).
(Aromatic Amine Resin Component B)
An aromatic amine resin component B was prepared by mixing 1.27 parts by weight of an aromatic polyamine (manufactured by Wako Pure Chemical Industries, Ltd., 4,4'-diaminodiphenyl ether) with 3.73 parts by weight of bisphenol A propoxy diglycidyl ether (manufactured by Wako Pure Chemical Industries, Ltd., epoxy equivalent: 228 g/eq).
(Aromatic Amine Resin Component C)
An aromatic amine resin component C was prepared by mixing 1.44 parts by weight of an aromatic polyamine (manufactured by Tokyo Chemical Industry Co., Ltd., 4,4'-methylenebis(2-ethyl-6-methylaniline)) with 3.56 parts by weight of a phenol novolak type epoxy resin (manufactured by Mitsubishi Chemical Corporation, "jER152", epoxy equivalent: 174 g/eq).

(Non-Aromatic Amine Resin Component A)
A non-aromatic amine resin component A was prepared by mixing 0.25 parts by weight of dicyandiamide (manufactured by Mitsubishi Chemical Corporation, "DICY-7") with 4.75 parts by weight of bisphenol A propoxy diglycidyl ether (manufactured by Wako Pure Chemical Industries, Ltd., epoxy equivalent: 228 g/eq).
(Non-Aromatic Amine Resin Component B)
A non-aromatic amine resin component B was prepared by mixing 0.83 parts by weight of an imidazole (an imidazole-based epoxy adduct curing agent, manufactured by Ajinomoto Fine Techno Co., PN-23) with 4.17 parts by weight of bisphenol A propoxy diglycidyl ether (manufactured by Wako Pure Chemical Industries, Ltd., epoxy equivalent: 228 g/eq).
(Non-Aromatic Amine Resin Component C)
A non-aromatic amine resin component C was prepared by mixing 2.07 parts by weight of methyl-1,2,3,6-tetrahydrophthalic anhydride (manufactured by Wako Pure Chemical Industries, Ltd.) and 0.01 parts by weight of benzyldimethylamine with 2.84 parts by weight of bisphenol A propoxy diglycidyl ether (manufactured by Wako Pure Chemical Industries, Ltd., epoxy equivalent: 228 g/eq).
(Silver Flake A)
A silver flake A was prepared in accordance with Example 2 of Japanese Patent No. 4,144,856. The average particle diameter (D50) of the resulting silver flake A was 6.2 μm and the value X was 5.01%.
(Silver Flake B)
A silver flake B was prepared in accordance with Example 2 of Japanese Patent No. 4,399,799. The average particle diameter (D50) of the resulting silver flake A was 2.2 μm and the value X was 7.88%.
(Silver Flake C)
A commercially available silver flake (manufactured by Mitsui Mining and Smelting Co., Ltd., "Q03R flake 2") was used. The silver flake was obtained by flattening a sphere silver powder in a ball mill, the powder being prepared by liquid-phase reduction of a silver salt. The average particle diameter (D50) thereof was 1.1 μm and the value X was 30.8%.

Incidentally, the following will show measurement methods or evaluation methods of various physical properties and characteristics.
(Average Particle Diameter)
The average particle diameter (D50) of each of the silver flakes is a volume-based median particle diameter measured by using a laser diffraction scattering particle size distribution measuring device (manufactured by Nikkiso Co., Ltd., "Micro Track").
(Crystallinity)
The crystallinity of each of the silver flakes was measured as follows.

A press ring was attached to the position approximately 2 mm lower from a sample surface of a sample holder and a silver flake powder was charged. The sample surface was brought into close-contact to the glass plate, and then, the press ring was pushed with a pressing jig from the opposite side and the silver flake powder was hardened so that the sample surface became flat, thereby preparing a measurement sample.

By using a X-ray diffraction apparatus (manufactured by RIGAKU, RINT1200), the measurement was performed under measurement conditions of a 2θ/θ scan method, an X-ray wavelength of CuKα line (λ=0.15418 nm), and a scanning angle of 35 to 55°, and a value of $\lambda=[I_{200}/(I_{111}+I_{200})]\times 100$ (%) was calculated when integrated intensity values of diffraction peaks from a (111) plane at approximately 38° and a (200) plane at approximately 44° derived from silver were taken as $I_{111}$ and $I_{200}$, respectively.

The crystallinity of a conductive composition (or a cured product thereof) was measured as follows.

A conductive composition was applied onto a polytetrafluoroethylene (PTFE) plate by using an applicator and heated at 120° C. for 30 minutes and subsequently at 200° C. for 90 minutes to prepare a film-shaped cured product having a thickness of approximately from 200 to 400 mm. The film-shaped cured product was peeled from the polytetrafluoroethylene plate and X-ray diffraction measurement was performed for the surface coated by the applicator (front surface side) and the surface that had been in contact with the PTFE plate (PTFE side) under the same conditions as in the case of the silver flakes and a value X was calculated.

(Resistivity)

A conductive composition was applied to a slide glass by using an applicator, dried at 120° C. for 30 minutes, and fired at 200° C. for 90 minutes to form a conductive film having a thickness of 15 μm, and then resistivity was calculated from surface resistance measured by a four-point probe method and film thickness measured by a stylus type film thickness meter.

(Peeling Test)

A conductive composition was applied to a slide glass (substrate) by using an applicator, dried at 120° C. for 30 minutes, and then fired at 200° C. for 90 minutes to form a conductive film having a thickness of 15 μm.

A cellophane tape having a width of 24 mm (manufactured by Nichiban Co., Ltd.) was attached to the conductive film formed on the glass substrate and a load of approximately 5 kgf was applied thereon. Then, the resultant was rubbed with the load so that air bubbles between the conductive film and the cellophane tape disappeared, thereby removing the air bubbles to adhere the cellophane tape to the substrate. Thereafter, the cellophane tape was lifted up with fixing the substrate and was peeled off all at once at a rate of approximately 0.6 second while care was taken so that the angle between the substrate and the tape was approximately 90°. The close contact was judged to be good (A) in the case where any peeling of the conductive film was not attached to the tape and the close contact was judged to be not good (B) in the case where a part or all of the conductive film was peeled off.

(Bond Strength)

By using a conductive composition, a silicon chip of 3.5 mm×3.5 mm was attached to a copper plate having a thickness of 2 mm, dried at 120° C. for 30 minutes, and then fired at 200° C. for 90 minutes to bond the silicon chip to the copper plate. Thereafter, evaluation was performed by measuring shear strength. Incidentally, the silicon chip had vapor-deposited films formed by sputtering titanium, platinum and gold in this order on silicon, bonding surface being the vapor-deposited surface of gold. The thickness of the bonding layer after curing was 30 p.m. Incidentally, the bond strength was measured for four samples.

(Thermal Conductivity)

By using a resistivity value measured, thermal conductivity was measured by using an equation according to the Wiedemann-Franz law: $\lambda = L \times T/\rho v$ ($\lambda$ is thermal conductivity, L is Lorentz number ($2.44 \times 10^{-8}$ W·Ω·K$^{-2}$), T is absolute temperature (298K), and $\rho v$ is resistivity).

Example 1

A conductive composition was obtained by kneading 100 parts by weight of the silver flake A, 5 parts by weight of the aromatic amine resin component A, and 10 parts by weight of triethylene glycol monobutyl ether (manufactured by Wako Pure Chemical Industries, Ltd.) as a solvent by a three-roll. Then, for the resulting conductive composition, various characteristics were evaluated. Incidentally, the value X of the cured product was 1.92% on the front surface side and 1.65% on the PTFE side.

Example 2

A conductive composition was obtained in the same manner as in Example 1 except that 5 parts by weight of the aromatic amine resin component B was used instead of 5 parts by weight of the aromatic amine resin component A in Example 1. Then, for the resulting conductive composition, various characteristics were evaluated. Incidentally, the value X of the cured product was 1.54% on the front surface side and 1.44% on the PTFE side.

Example 3

A conductive composition was obtained in the same manner as in Example 1 except that 5 parts by weight of the aromatic amine resin component C was used instead of 5 parts by weight of the aromatic amine resin component A in Example 1. Then, for the resulting conductive composition, various characteristics were evaluated. Incidentally, the value X of the cured product was 1.64% on the front surface side and 1.23% on the PTFE side.

Example 4

A conductive composition was obtained in the same manner as in Example 1 except that the aromatic amine resin component A was used in an amount of 7.5 parts by weight instead of 5 parts by weight in Example 1. Then, for the resulting conductive composition, various characteristics were evaluated. Incidentally, the value X of the cured product was 1.13% on the front surface side and 1.04% on the PTFE side.

Example 5

A conductive composition was obtained in the same manner as in Example 1 except that the aromatic amine resin component A was used in an amount of 10 parts by weight instead of 5 parts by weight in Example 1. Then, for the resulting conductive composition, various characteristics were evaluated. Incidentally, the value X of the cured product was 1.28% on the front surface side and 1.23% on the PTFE side.

Example 6

A conductive composition was obtained in the same manner as in Example 1 except that 100 parts by weight of the silver flake B was used instead of 100 parts by weight of the silver flake A in Example 1. Then, for the resulting conductive composition, various characteristics were evaluated. Incidentally, the value X of the cured product was 3.74% on the front surface side and 2.25% on the PTFE side.

Comparative Example 1

A conductive composition was obtained in the same manner as in Example 1 except that 5 parts by weight of the non-aromatic amine resin component A was used instead of 5 parts by weight of the aromatic amine resin component A in Example 1. Then, for the resulting conductive composition, various characteristics were evaluated. Incidentally, the value X of the cured product was 1.42% on the front surface side and 1.11% on the PTFE side.

Comparative Example 2

A conductive composition was obtained in the same manner as in Example 1 except that 5 parts by weight of the non-aromatic amine resin component B was used instead of 5 parts by weight of the aromatic amine resin component A in Example 1. Then, for the resulting conductive composition, various characteristics were evaluated. Incidentally, the value X of the cured product was 1.62% on the front surface side and 1.54% on the PTFE side.

Comparative Example 3

A conductive composition was obtained in the same manner as in Example 1 except that 5 parts by weight of the non-aromatic amine resin component C was used instead of 5 parts by weight of the aromatic amine resin component A in Example 1. Then, for the resulting conductive composition, various characteristics were evaluated. Incidentally, the value X of the cured product was 1.79% on the front surface side and 1.86% on the PTFE side.

Comparative Example 4

A conductive composition was obtained in the same manner as in Example 1 except that 100 parts by weight of the silver flake C was used instead of 100 parts by weight of the silver flake A in Example 1. Then, for the resulting conductive composition, various characteristics were evaluated. Incidentally, the value X of the cured product was 30.8% on the front surface side and 30.4% on the PTFE side.

The results are shown in Table 1. In Table 1, "amine type" means an abbreviation of "amine resin component".

In Table 1, in Examples 1 to 6 where silver flakes having large crystallinity (small value X) and an aromatic amine resin component were used, high conductivity (small resistivity) and high heat radiation property (large thermal conductivity) were achieved and close contact to a base material (peeling test, shear strength) was also high. On the other hand, in Comparative Examples 1 to 3 where the resin component was non-aromatic amine type one, conductivity was small (resistivity was large), heat radiation property was also small (thermal conductivity was small) and close contact to a base material also became slightly small even when a silver flake having large crystallinity (small value X) was used. Moreover, even when an aromatic amine resin component was used, in Comparative Example 4 where the crystallinity of the silver flake was small (value X was large), conductivity was small (resistivity was large), heat radiation property was also small (thermal conductivity was small) and close contact to a base material also became slightly small.

Incidentally, the value X inside the thick film of each of the conductive compositions of Examples and Comparative Examples described above was measured as follows. Each of the conductive compositions was poured into a mold (depth of 5 mm, diameter of 10 mmϕ) and molded and, after the mold was removed, the molded one was heated at 120° C. for 30 minutes and subsequently at 200° C. for 90 minutes to prepare a thick film cured product. The sample was cut at a central part in a thickness direction and the value X was measured for the cut surface. The results are shown in Table 2.

TABLE 2

|  | Value X of film-shaped cured product (%) | | Value X of thick film cured product (%) |
| --- | --- | --- | --- |
|  | Front surface side | PTFE side | Central part of film |
| Example 1 | 1.92 | 1.65 | 23.6 |
| Example 2 | 1.54 | 1.44 | 22.6 |
| Example 3 | 1.64 | 1.23 | 22.7 |
| Example 4 | 1.13 | 1.04 | 23.2 |
| Example 5 | 1.28 | 1.23 | 22.4 |
| Example 6 | 3.74 | 2.25 | 24.8 |
| Comp. Ex. 1 | 1.42 | 1.11 | 23.2 |
| Comp. Ex. 2 | 1.62 | 1.54 | 22.3 |
| Comp. Ex. 3 | 1.79 | 1.86 | 23.1 |
| Comp. Ex. 4 | 30.8 | 30.4 | 35.0 |

TABLE 1

|  | Silver flake | | | Resin component | | |  | Shear | Thermal |
| --- | --- | --- | --- | --- | --- | --- | --- | --- | --- |
|  | kind | value X (%) | parts by weight | kind | parts by weight | Resistivity μΩ·cm | Peeling test | strength N | conductivity W/(m·k) |
| Example 1 | A | 5.01 | 100 | Aromatic amine type A | 5 | 9.5 | A | 218 | 77 |
| Example 2 | A | 5.01 | 100 | Aromatic amine type B | 5 | 9.3 | A | 125 | 78 |
| Example 3 | A | 5.01 | 100 | Aromatic amine type C | 5 | 11.1 | A | 83 | 66 |
| Example 4 | A | 5.01 | 100 | Aromatic amine type A | 7.5 | 12.9 | A | 163 | 56 |
| Example 5 | A | 5.01 | 100 | Aromatic amine type A | 10 | 14.2 | A | 145 | 51 |
| Example 6 | B | 7.88 | 100 | Aromatic amine type A | 5 | 12.4 | A | 98 | 59 |
| Comparative Example 1 | A | 5.01 | 100 | Non-aromatic amine type A | 5 | 2000.1 | A | 38.8 | 0.36 |
| Comparative Example 2 | A | 5.01 | 100 | Non-aromatic amine type B | 5 | 113.1 | A | 78.5 | 6 |
| Comparative Example 3 | A | 5.01 | 100 | Non-aromatic amine type C | 5 | 17.9 | A | 62.9 | 41 |
| Comparative Example 4 | C | 30.8 | 100 | Aromatic amine type A | 5 | 39.8 | A | 66 | 18 |

From Table 2, in Examples 1 to 6 and Comparative Examples 1 to 3 where a crystalline metal flake was used, the value X inside the thick film became as large as 22 to 25% as compared with the front surface part of the thin film. On the other hand, in Comparative Example 4 where a metal flake having small crystallinity was used, the value X similar to that at the front surface part of the thin film was observed and was as large as 35%.

INDUSTRIAL APPLICABILITY

Since the conductive composition of the present invention can realize high conductivity, it can be utilized in various use applications, for example, as a composition for forming wiring, circuits, electrodes, and the like and as a conductive adhesive and the like. Particularly, since the conductive composition can realize high conductivity and heat radiation property without impairing high close contact, it is suitable as a conductive adhesive for bonding two base materials each other.

While the present invention has been described in detail and with reference to specific embodiments thereof, it will be apparent to one skilled in the art that various changes and modifications can be made therein without departing from the spirit and scope of the present invention.

The present application is based on Japanese Patent Application No. 2014-032895 filed on Feb. 24, 2014 and Japanese Patent Application No. 2015-021464 filed on Feb. 5, 2015, and the contents thereof are incorporated herein by reference.

The invention claimed is:

1. A conductive composition comprising a conductive metal powder and thermosetting resin composition comprising a thermosetting epoxy resin and an aromatic amine-based curing agent, wherein the conductive metal powder comprises at least a metal flake having a crystalline structure in which a metal crystal grows in a flake shape, wherein the thermosetting epoxy resin is bisphenol A propoxy diglycidyl ether or a phenol novolak epoxy resin, wherein the aromatic amine-based curing agent is 4, 4'-methylenebis(2-ethyl-6-methylaniline) or 4, 4'-diaminodiphenyl ether; and further wherein;

a ratio of the thermosetting resin composition is from 3 to 15 parts by weight, relative to 100 parts by weight of the metal flake;

a ratio of the aromatic amine-based curing agent is from 5 to 80 parts by weight, relative to 100 parts by weight of the thermosetting epoxy resin; and the metal flake is a silver flake having an average particle diameter of 1 to 10 μm and having a value X represented by the following equation of 1 to 10% when diffraction integrated intensity values of a (111) plane and a (200) plane in X-ray diffraction are taken as $I_{111}$ and $I_{200}$, respectively:

$$X=[I_{200}/(I_{111}+I_{200})]\times 100\ (\%).$$

2. The conductive composition according to claim 1, which is a conductive adhesive.

3. A method of bonding a metal base material to a semiconductor base material comprising applying the conductive adhesive of claim 2 to the metal base material, the semiconductor base material, or both, and pressing together the metal base material and the semiconductor base material.

4. A conductive molded body comprising at least a conductive portion formed of the conductive composition described in claim 1.

5. The conductive molded body according to claim 4, which is a molded body comprising a conjugated base material composed of two base materials and a conductive adhesive that intervenes between the two base materials and bonds the two base materials each other, wherein the conductive adhesive as the conductive portion is formed of the conductive composition described in claim 1.

* * * * *